United States Patent
Tsai et al.

(10) Patent No.: US 9,653,349 B2
(45) Date of Patent: May 16, 2017

(54) SEMICONDUCTOR INTEGRATED CIRCUIT WITH NANO GAP

(71) Applicant: Taiwan Semiconductor Manufacturing Company, Ltd., Hsin-Chu (TW)

(72) Inventors: Cheng-Hsiung Tsai, Miaoli County (TW); Chieh-Han Wu, Kaohsiung (TW); Chung-Ju Lee, Hsinchu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 213 days.

(21) Appl. No.: 14/163,359

(22) Filed: Jan. 24, 2014

(65) Prior Publication Data
US 2015/0214143 A1    Jul. 30, 2015

(51) Int. Cl.
| | |
|---|---|
| H01L 21/768 | (2006.01) |
| H01L 23/532 | (2006.01) |
| H01L 23/522 | (2006.01) |
| H01L 21/311 | (2006.01) |

(52) U.S. Cl.
CPC .. *H01L 21/76829* (2013.01); *H01L 21/31144* (2013.01); *H01L 21/7682* (2013.01); *H01L 23/5222* (2013.01); *H01L 23/5329* (2013.01); *H01L 23/53295* (2013.01); *H01L 23/53223* (2013.01); *H01L 23/53238* (2013.01); *H01L 23/53266* (2013.01); *H01L 2924/0002* (2013.01)

(58) Field of Classification Search
CPC .................................................. H01L 21/7682
See application file for complete search history.

(56) References Cited

U.S. PATENT DOCUMENTS

| | | | | |
|---|---|---|---|---|
| 2008/0311402 A1* | 12/2008 | Jung | .................... | B82Y 10/00 428/409 |
| 2012/0141741 A1* | 6/2012 | Millward | ................. | B05D 1/34 428/173 |
| 2013/0009315 A1* | 1/2013 | Colburn | .............. | H01L 23/5222 257/774 |
| 2015/0037980 A1* | 2/2015 | Rha | ....................... | H01L 21/306 438/700 |

FOREIGN PATENT DOCUMENTS

KR    10-2013-0091685    *    2/2015    ............ H01L 21/31

OTHER PUBLICATIONS

Sudrani et al., Guiding Polymers to Perfection: Macroscopic Alignment of Nanoscale Domains, 2004, Nano Letters, vol. 4, No. 2, p. 273-276.*
Machine translation into english of KR 10-2013-0091685.*

* cited by examiner

*Primary Examiner* — Lex Malsawma
*Assistant Examiner* — J. R. Oakley
(74) *Attorney, Agent, or Firm* — Haynes and Boone, LLP (57) ABSTRACT

A method of fabricating a semiconductor integrated circuit (IC) is disclosed. A substrate having a dielectric layer over it is provided. A block co-polymer (BCP) layer is deposited over the dielectric layer. The BCP layer is then annealed to form a first polymer nanostructures surrounded by a second polymer nanostructures over the dielectric layer. The second polymer nanostructure is selectively etched using the first polymer nanostructure as an etch mask to form a nano-block. The dielectric layer is selectively etched using the nano-block as an etch mask to form a nano-trench. The nano-trenched is sealed to form a nano-air-gap.

19 Claims, 12 Drawing Sheets

SEMICONDUCTOR INTEGRATED CIRCUIT WITH NANO GAP

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop improved dielectric and metal interconnection structures and processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
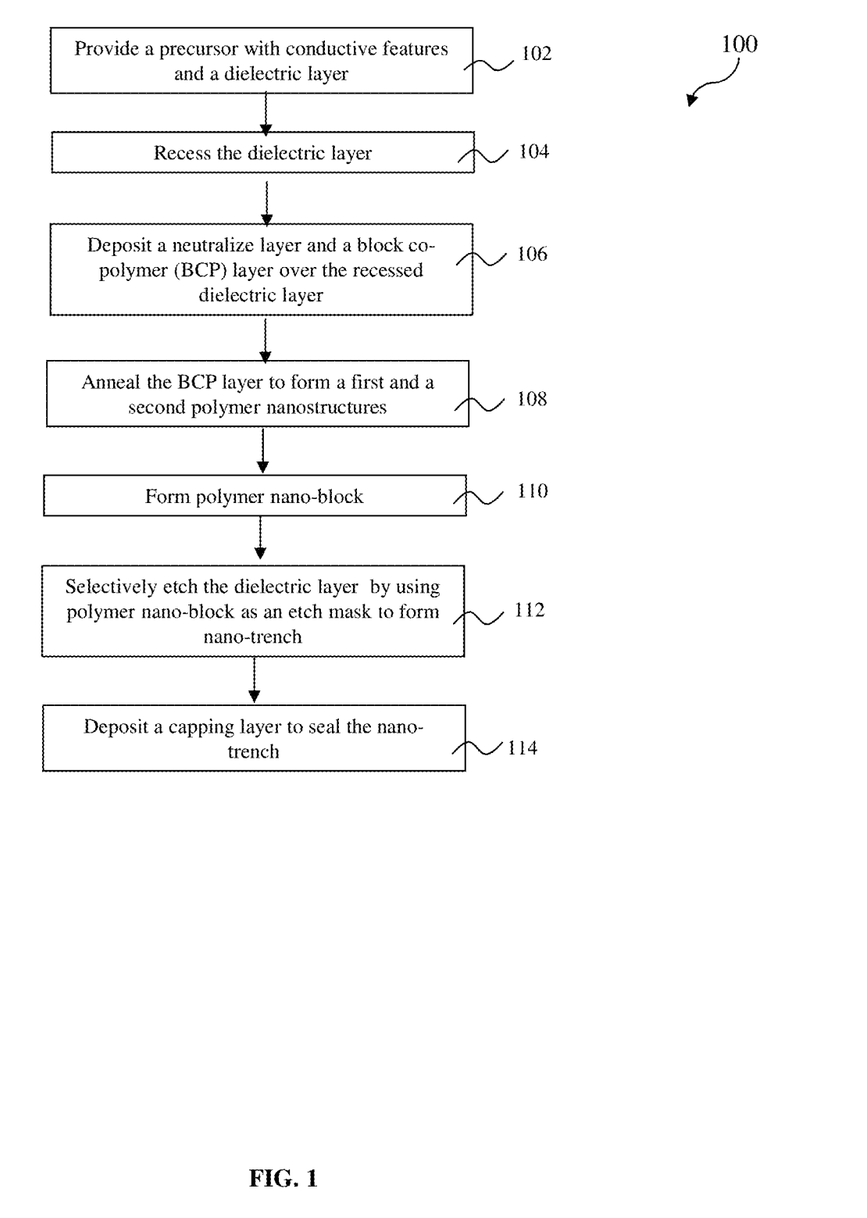
FIG. 1 is a flowchart of an example method for fabricating a semiconductor integrated circuit (IC) constructed in accordance with some embodiments.

FIG. 1 is a flowchart of a method 100 of fabricating one or more semiconductor devices according to aspects of the present disclosure. The method 100 is discussed in detail below, with reference to a semiconductor device precursor 200 and a semiconductor device 800, shown in FIGS. 2, 3, 4, 5A to 5C, 6A to 6C, 7 and 8 for the sake of examples.

Figure 2:
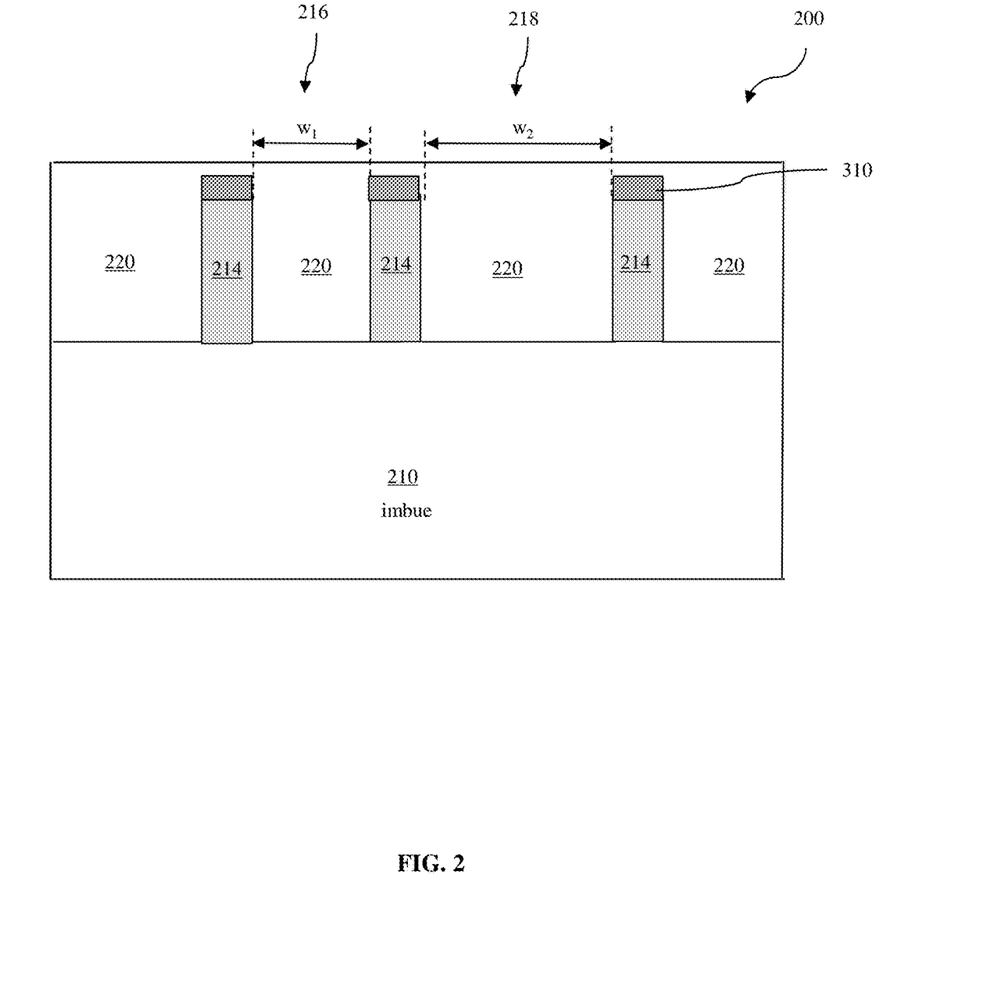
FIGS. 2, 3, 4, 5A to 5C, 6A to 6C, 7 and 8 are cross sectional views of an example IC device constructed at fabrication stages constructed according to the method of FIG. 1.

Referring to FIGS. 1 and 2, the method 100 begins at step 102 by receiving a device precursor 200. The device precursor 200 includes a semiconductor substrate 210, such as a silicon wafer. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The device precursor 200 may also include isolation features formed to isolate active regions of the substrate 210. The isolation features may include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The device precursor 200 may also include gate stacks formed by dielectric layers and electrode layers on the substrate 210. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, or other suitable techniques. The electrode layers may include a single layer or multi layers, such as metal layer, liner layer, wetting layer, and adhesion layer, formed by ALD, PVD, CVD, or other suitable process.

The device precursor 200 also includes conductive features 214 formed on and/or extending above the substrate 210, having a first space 216 and a second space 218 between conductive features 214, respectively. A first width $w_1$ of the first space 216 may be different to a second width $w_2$ of the second space 218. As an example, the second width $w_2$ is substantially larger than the first $w_1$.

The conductive features 214 include a portion of the interconnect structure. For example, the conductive features 214 include contacts, metal vias, or metal lines. The conductive features 214 may include aluminum (Al), copper (Cu) or tungsten (W). In one embodiment, the conductive features 214 are further surrounded by a barrier layer to prevent diffusion and/or provide material adhesion. The barrier layer may include titanium nitride (TiN), tantalum nitride (TaN), tungsten nitride (WN), titanium silicon nitride (TiSiN) or tantalum silicon nitride (TaSiN). The conductive features 214 (and the barrier layer) may be formed by a procedure including lithography, etching and deposition. In another embodiment, the conductive features 214 include copper lines. In yet another embodiment, the conductive features 214 include electrodes, capacitors, resistors or a portion of a resistor. Alternatively, the conductive features 214 may include doped regions (such as sources or drains), or gate electrodes. In another example, the conductive features 214 are silicide features disposed on respective sources, drains or gate electrodes.

Figure 3:
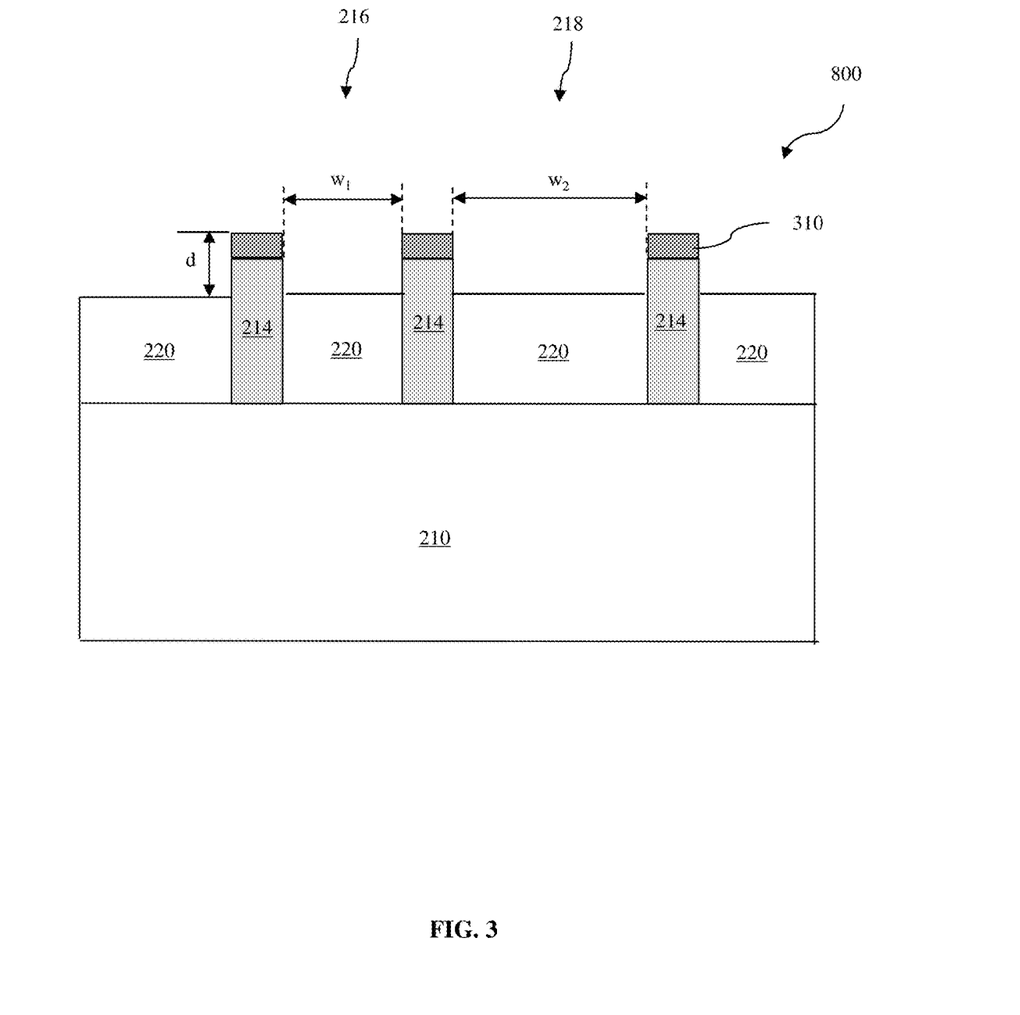

The conductive feature 214 may have a cap 310 on top of it. The cap 310 may include tantalum (Ta), titanium (Ti), manganese (Mn), cobalt (Co), ruthenium (ru), titanium nitride (TiN), tantalum nitride (TaN), tungsten nitride (WN), titanium silicon nitride (TiSiN), tantalum silicon nitride (TaSiN), manganese oxide (MnO), aluminium nitride, aluminum oxide, or other suitable materials. The cap 310 may be formed by processes of deposition, photolithography and etch.

The device precursor 200 also includes an inter-level dielectric (ILD) layer 220. The ILD layer 220 include a dielectric material layer, such as silicon oxide, silicon nitride, a dielectric material layer having a dielectric constant (k) lower than thermal silicon oxide (therefore referred to as low-k dielectric material layer), or other suitable dielectric material layer. A process of forming the ILD layer 220 may utilize spin-on coating or chemical vapor deposition (CVD).

Referring to FIGS. 1 and 3, the method 100 proceeds to step 104 by recessing the ILD layer 220 to below a top surface of the conductive features 214 with a depth d. The depth d is designed to guide a formation of a plurality of self-assembled nanostructures in a subsequent step, which will be described in the following description. As an example, the depth d is in a range from 100 Å to 400 Å. The recessing process may include a selective wet etch or a selective dry etch, which selectively etches the ILD layer 220, but substantially does not etch the first capping layer 310 and the conductive features 214.

Figure 4:
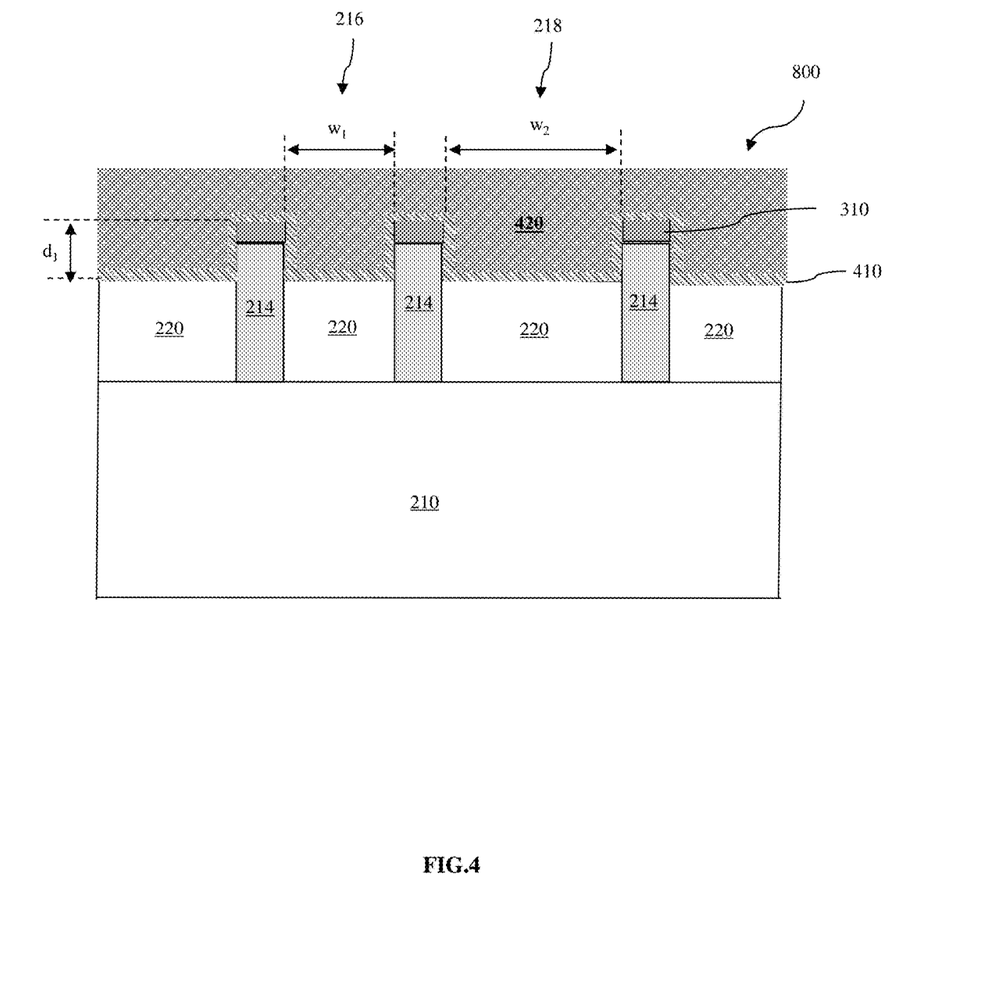

Referring to FIGS. 1 and 4, the method 100 proceeds to step 106 by depositing a neutralize layer (NL) 410 and a block co-polymer (BCP) layer 420 over the recessed ILD layer 220 and the conductive features 214. The NL 410 may include materials that having a surface energy which is in the middle of the two components in the BCP. As an example, the NL 410 includes polystyrene with OH bonding structure. The NL 410 may be deposited by ALD, CVD or spin-on coating.

The BCP layer 420 is then deposited over the NL 410. A BCP includes long-chain molecules comprised of at least two different segments, and these segments can assemble themselves into highly ordered structures under certain conditions, such as when they are exposed to an elevated temperature. The BCP layer 420 may include one or more of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA). The BCP layer 420 may be deposited by spin-on coating, spraying, dip coating, or other suitable methods. In one embodiment, the BCP layer 420 includes a PS-b-PDMS deposited by spin-on coating.

Figure 5A:
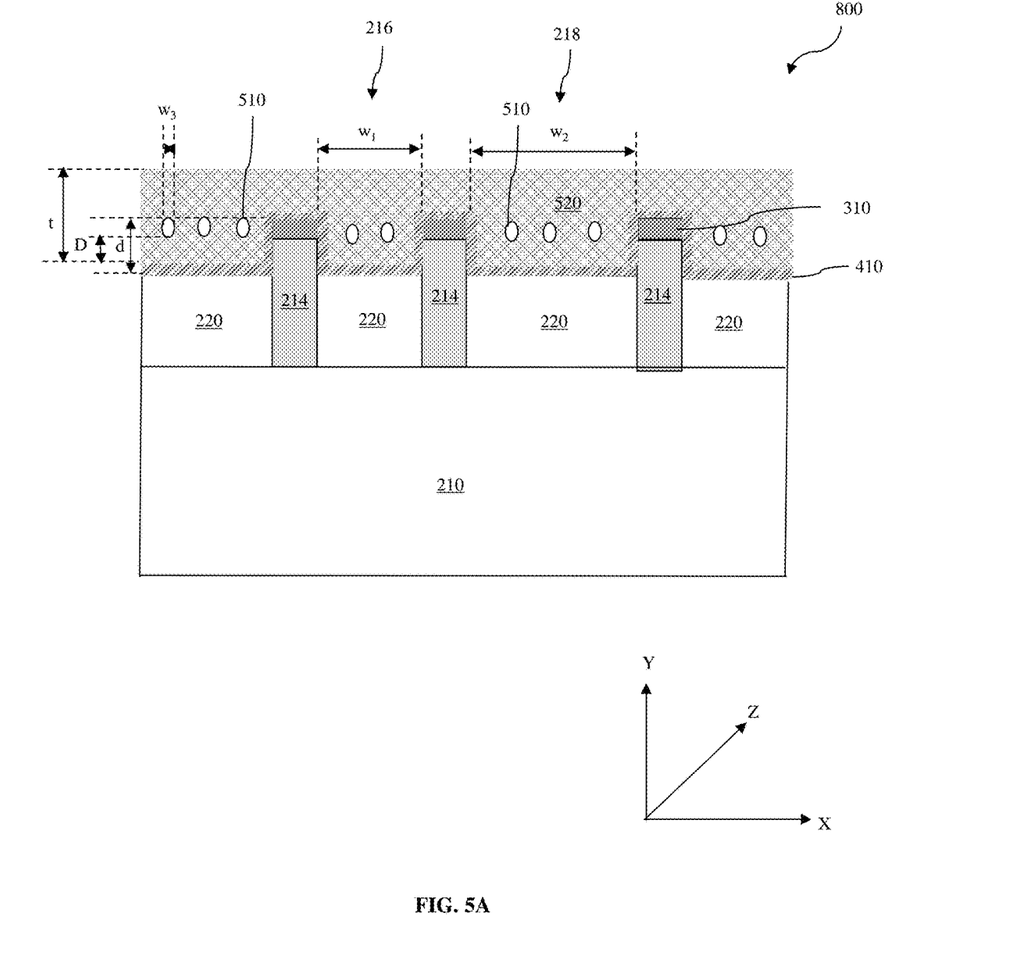

Referring to FIGS. 1 and 5A-5C, the method 100 proceeds to step 108 by applying a first elevated temperature anneal to the BCP layer 420 to achieve segregation in the BCP layer 420 to form first polymer nanostructures 510 and second polymer nanostructures 520. In one embodiment, the PS-b-PDMS layer 420 is annealed with a first temperature of about 250° C. and forms self-assembled PDMS nanostructure 510 surrounded by the PS layer 520 in the spaces 216 and 218. The PDMS nanostructures 510 are in cylindrical-shape and parallel to each other along a Z direction, which is perpendicular to both of a X direction and a Y direction (as shown in FIG. 5A). The Z direction is the same direction of the length of the conductive features 214, the Y direction is the same direction of the height of the conductive features 214 and perpendicular to the Z direction and X direction is perpendicular to both of the Y and Z directions. In this case, the first PDMS nanostructures 510 are formed in locations with a same distance D from the NL 410. The distance D may be controlled by the depth d of the recessed dielectric layer 220, the thickness t of the BCP layer 420 and the materials of the BCP layer 420. The distance D is targeted to be adequate for a thickness of a future hard mask, which will be described in the following description.

Figure 5B:
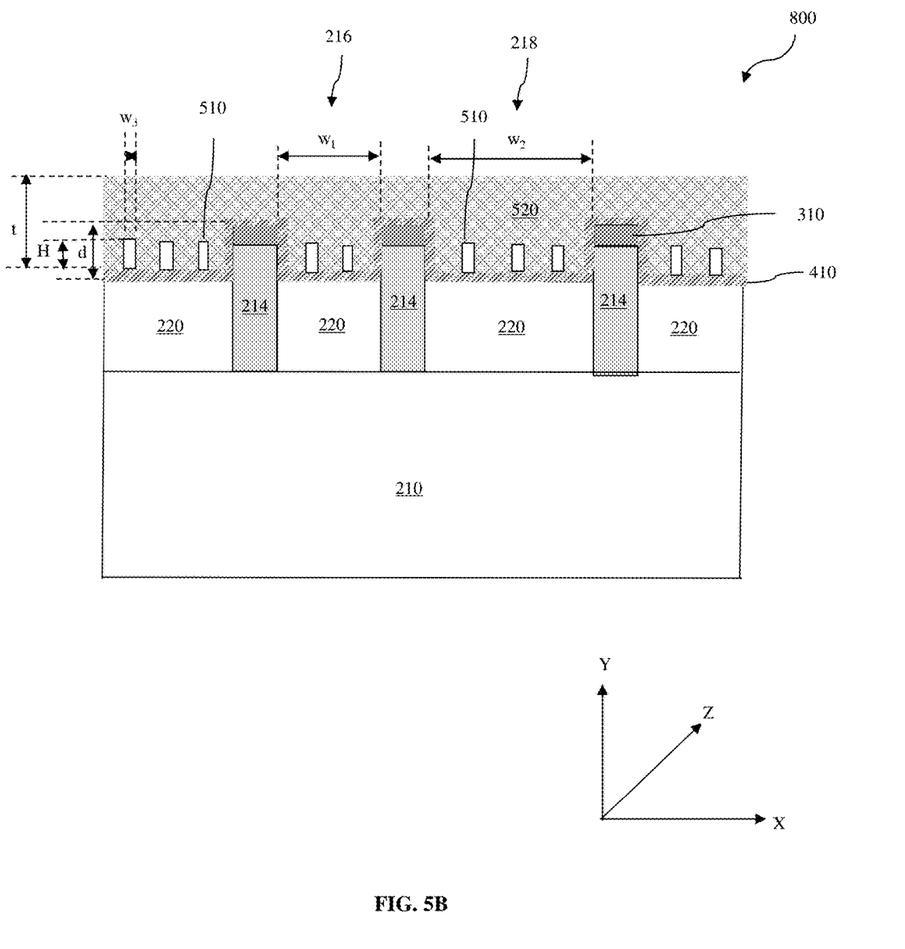

In another embodiment, the column-shape PS nanostructures 510 are formed and separated by the PMMA layer 520 in the spaces 216 and 218. The PS nanostructures 510 are parallel to each other along the Z direction, as shown in FIG. 5B. In this case, the PS nanostructures 510 are formed with a height H. The height H may be controlled by the depth d of the recessed dielectric layer 220, the thickness t of the BCP layer 420 and the materials of the BCP layer 420. The height H is targeted to be adequate for a thickness of a future hard mask, which will be described in the following description.

In yet another embodiment, the cylindrical-shape PS nanostructures 510 are formed along the Y-direction and separated by the polymer layer 520, PMMA or PDMS, in the spaces 216 and 218. The PS nanostructures 510 are parallel to each other and may have multiple rows along the Z direction, as shown in FIG. 5C.

Figure 5C:
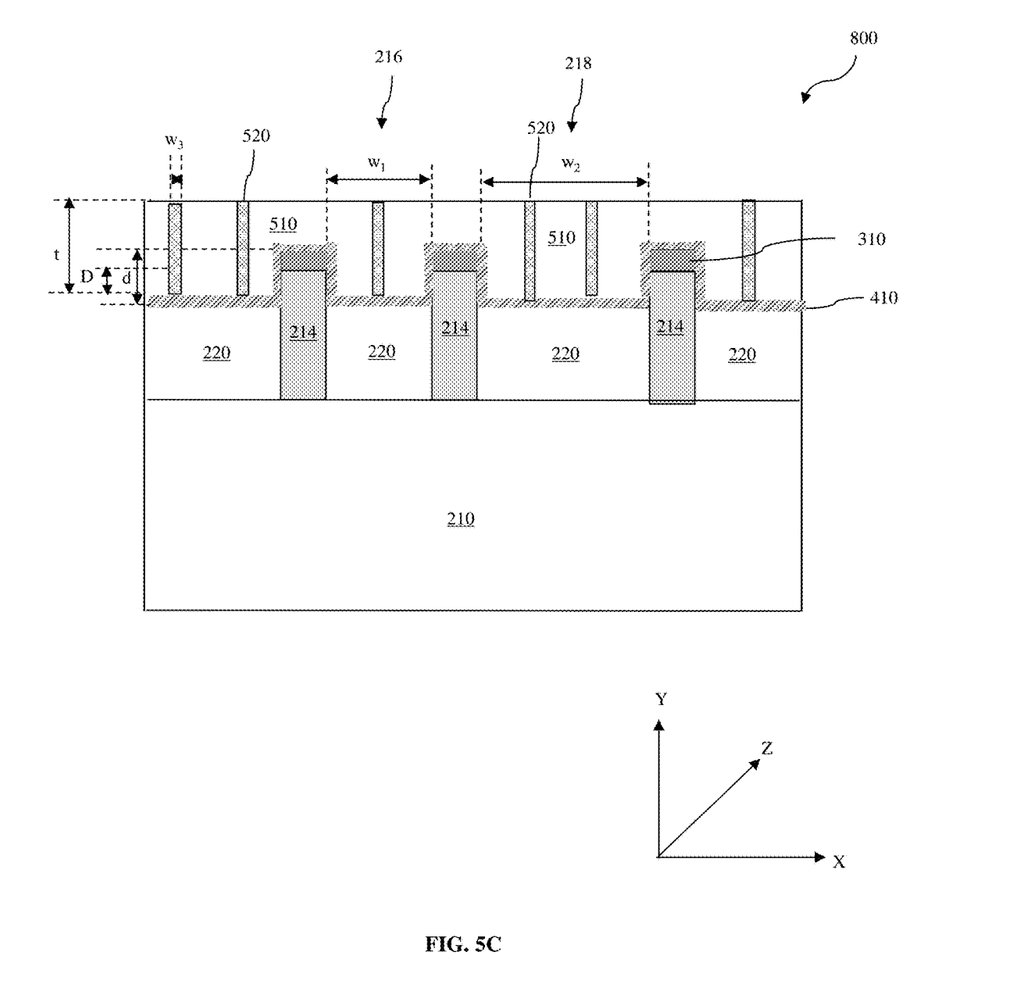

Referring also to FIGS. 5A-5C, a third width $w_3$ of the first polymer nanostructure 510 may be in the range of 5 nm-100 nm. For example, the third width $w_3$ of the first polymer nanostructure 510 is about 30 nm. In one embodiment, due to the second width $w_2$ is larger than the first width $w_1$, the space 218 may have more polymer nanostructures, 510 or 520, than the space 216 does.

Referring to FIGS. 1 and 6A-6C, the method 100 proceeds to step 110 by forming polymer nano-blocks 610. The polymer nano-blocks 610 are formed by selectively etching one type of polymer nanostructures but substantially not etching the other type of polymer nanostructures. The selective etch may include dry etch, wet etch, or combinations thereof. As an example, the PS layer 520 is decomposed by receiving second elevated temperature anneal with a second temperature. The second temperature is substantial higher than the first temperature of the first anneal. For example, the second temperature is about 350° C. As another example, the PS layer 520 is decomposed by a wet etch containing solutions of sulfuric acid (H2SO4) and peroxide (H2O2).

Figure 6A:
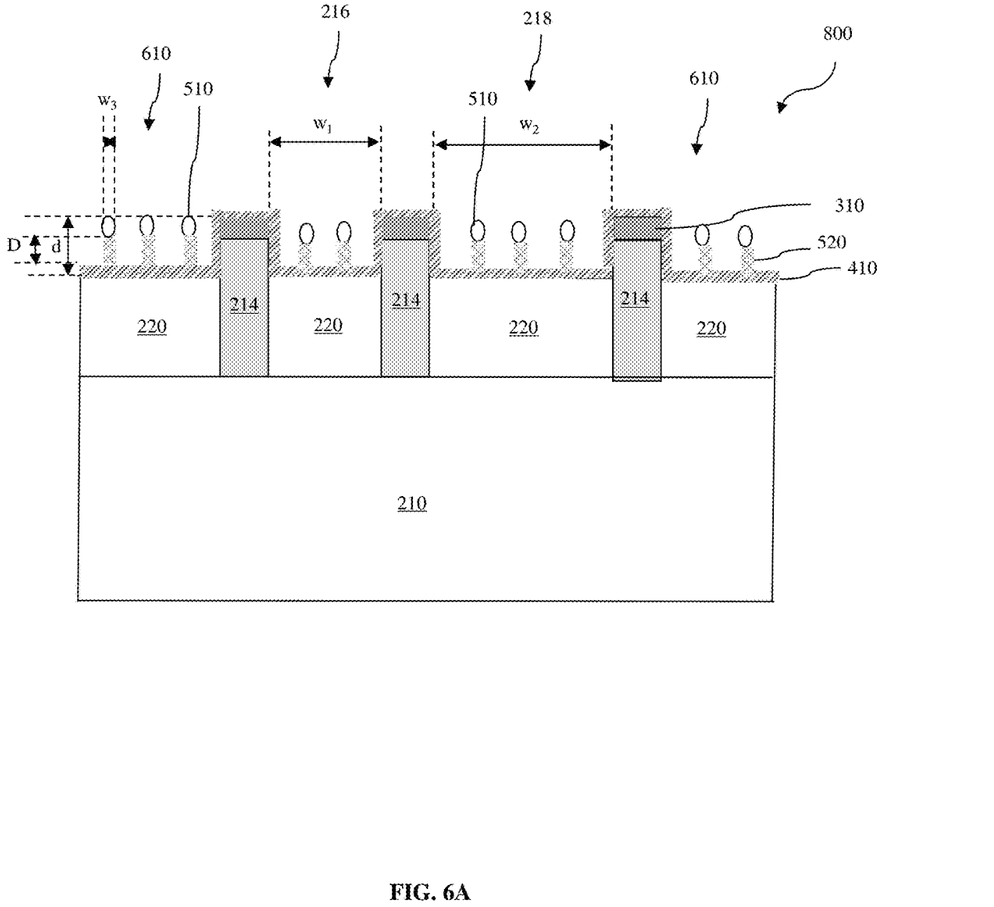

In one embodiment, the cylindrical-shape PDMS nanostructures 510 serve as an etch mask to protect the PS layer 520 underneath it while etching the PS layer 520, as shown in FIG. 6A. The protected PS layer 520 forms polymer nano-block 610. A width of the nano-block 610 is substantially similar to the width of the PDMS nanostructures 510 and a height of the nano-block 610 is substantially similar as the distance D.

Figure 6B:
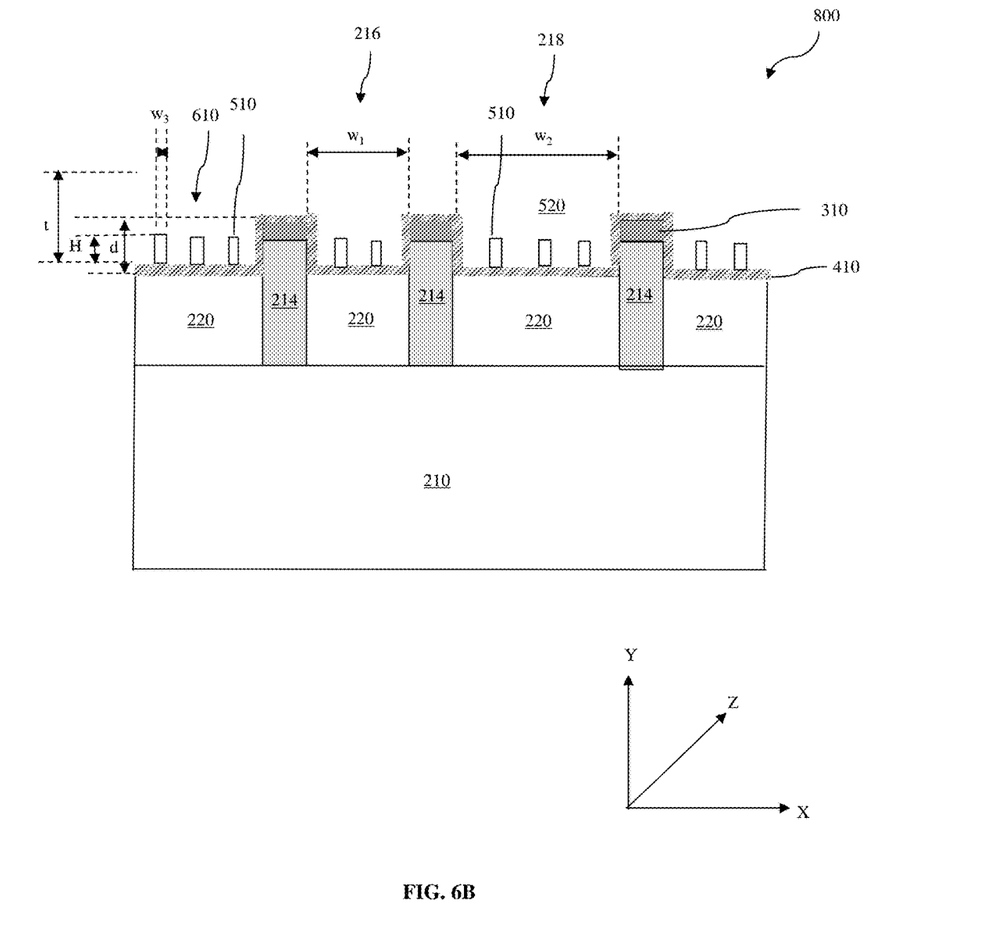

In another embodiment, the PMMA layer 520 is removed selectively and the column-shape PS nanostructures 510 remains intact, which serve as the polymer nano-blocks 610, as shown in FIG. 6B.

Figure 6C:
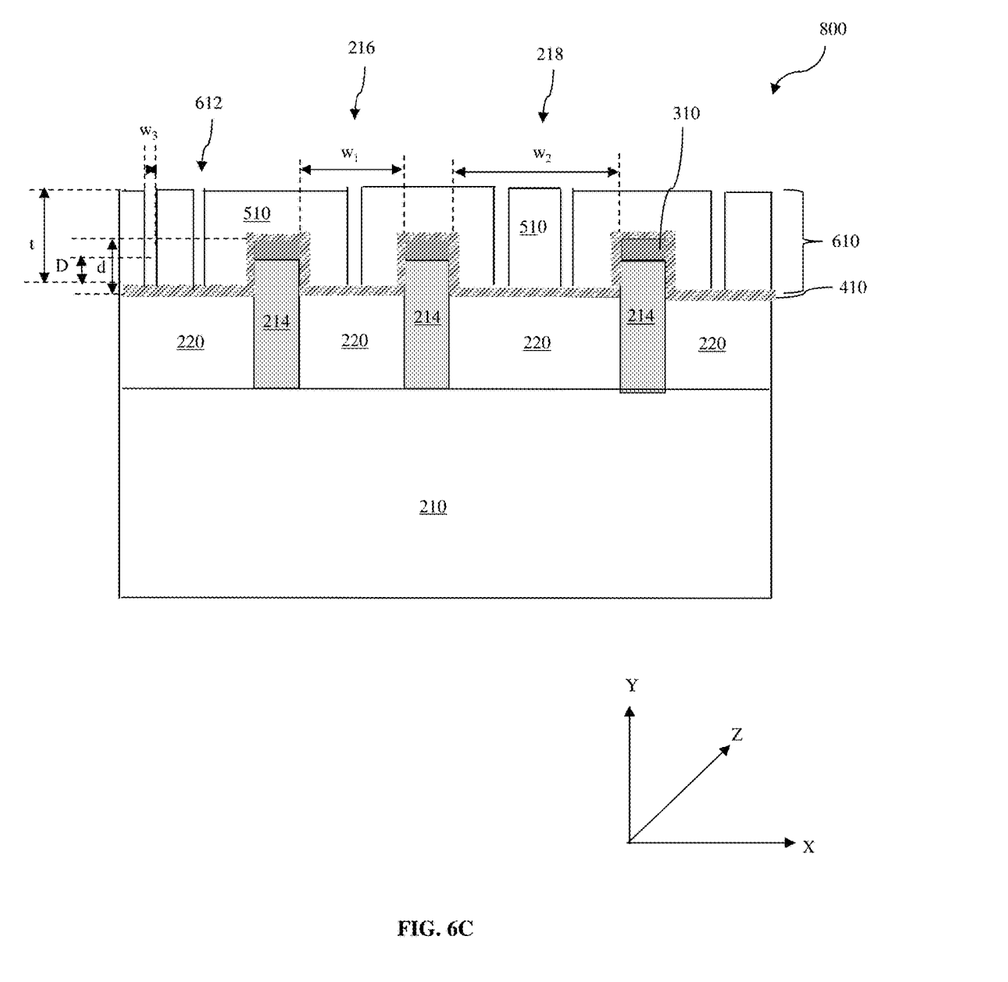

In yet another embodiment, the cylindrical-shape PS nanostructures 510 are removed selectively to form cylindrical-shape hollows 612 in the layer 520, PMMA or PDMS, which serves as the polymer nano-block 610, as shown in FIG. 6C. The cylindrical-shape hollows 612 carry the third width $w_3$.

Figure 7:
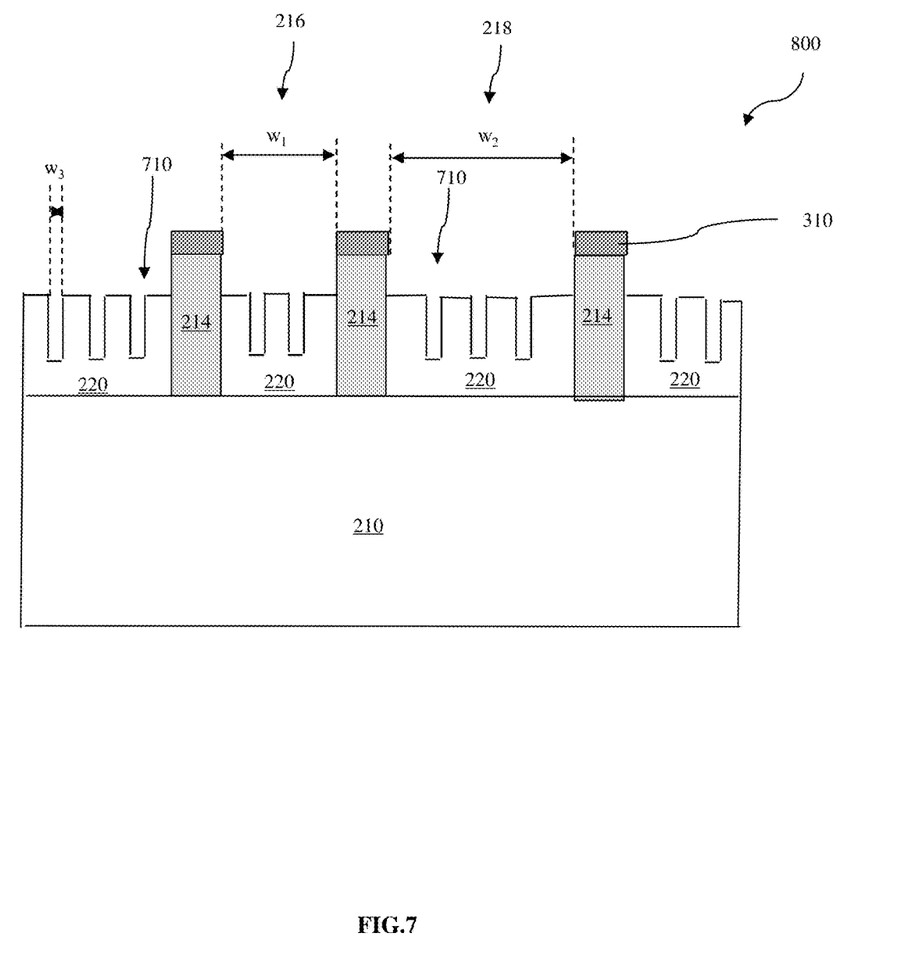

Referring to FIGS. 1 and 7, the method 100 proceeds to step 112 by selectively etching the NL layer 410 and a portion of the dielectric layer 220 using the nano-block 610 as an etch mask to form nano-trenches 710 in the dielectric layer 220. Therefore, the nano-trench 710 has a width substantially similar to a third width $w_3$. As has been mentioned previously, the height D of the nano-block 610 is targeted to be adequate as the etch mask during etching the dielectric layer 220.

The selective etch includes dry etch, wet etch, or combinations thereof. In one embodiment, dry etching processes include a biased plasma etching process that uses a fluorine-based chemistry, such as $CF_4$, $NF_3$ and $SF_6$. In another embodiment, an anisotropic etch is performed and form the nano-trench 710 with a vertical profile. After forming the nano-trench 710, the nano-block 610, as well as the first polymer nanostructure 510 are removed by any suitable processed, including wet etch and dry etch.

Figure 8:
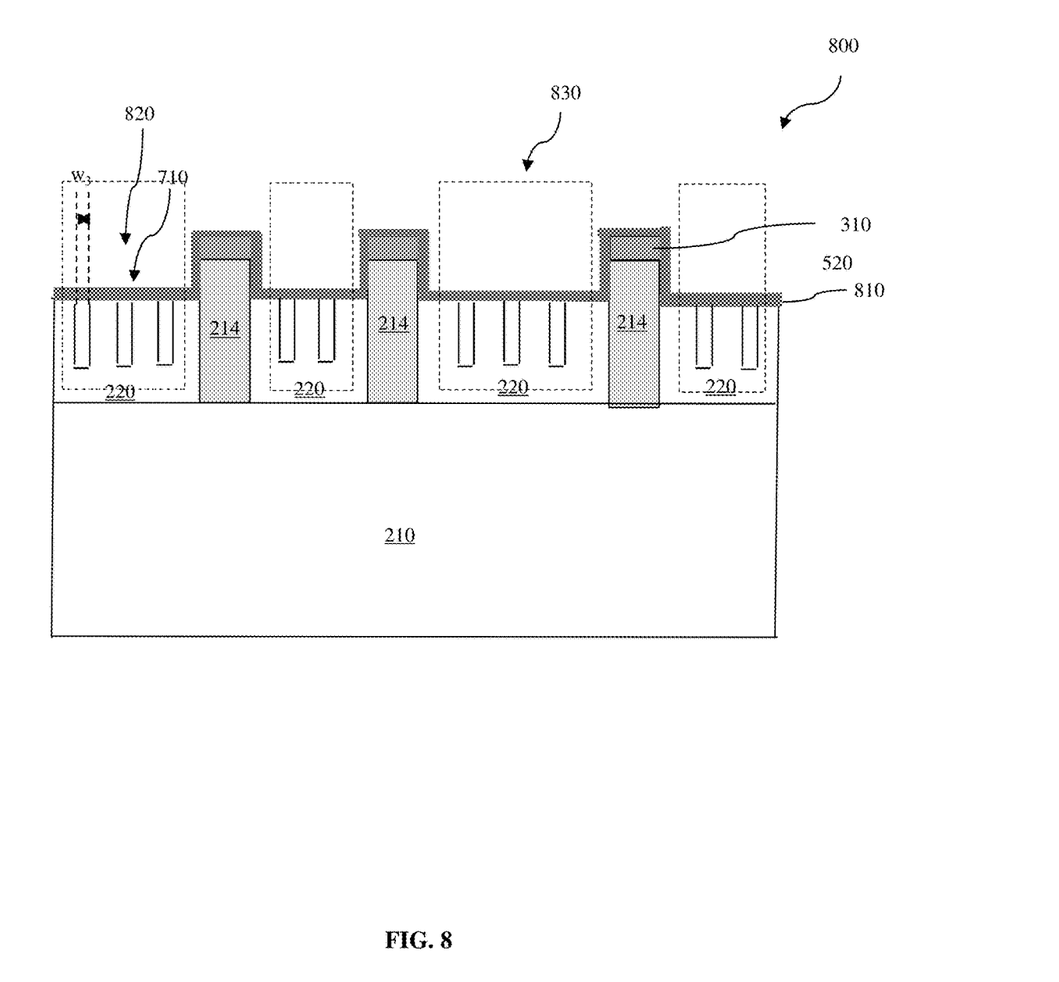

Referring to FIGS. 1 and 8, the method 100 proceeds to step 114 by depositing a capping layer 810 to seal the nano-trenches 710 to form nano-air-gaps 820 between two conductive features 214. The capping layer 810 may include silicon nitride, silicon oxynitride, silicon carbide, tantalum (Ta), titanium (Ti), manganese (Mn), cobalt (Co), ruthenium (ru), titanium nitride (TiN), tantalum nitride (TaN), tungsten nitride (WN), titanium silicon nitride (TiSiN), tantalum silicon nitride (TaSiN), manganese oxide (MnO), aluminum nitride, aluminum oxide, or other suitable materials. The capping layer 810 may be deposited by CVD, PVD, ALD, or any suitable techniques. In one embodiment, the capping layer 810 is also an etch stop layer (ESL) for a later etching process.

Being sealed by the second capping layer 810, the nano-trench 710 becomes a nano-air-gap 820. The nano-air-gap 820 carries the width w3. Together with the dielectric layer 220 and the nano-air-gap 820, dielectric matrixes 830 are formed to provide electronic isolation for conductive features 214. In one embodiment, Additional steps can be provided before, during, and after the method 100, and some of the steps described can be replaced, eliminated, or moved around for additional embodiments of the method 100.

The device 800 may undergo further CMOS or MOS technology processing to form various features and regions known in the art. For example, subsequent processing may form a multilayer interconnection includes vertical interconnects, such as conventional vias or contacts, and horizontal interconnects, such as metal lines. The various interconnection features may implement various conductive materials including copper, tungsten, and/or silicide to provide electrical routings to couple various devices in the substrate 210 to the input/output power and signals.

Based on the above, the present disclosure offers methods for fabricating IC device. The method provides a dielectric matrix formation. The dielectric matrix has nano-air-gaps imbedded in a dielectric layer. The method employs self-assembling polymer nanostructure formation, using the polymer nanostructure as an etch mask to form nano-trench and forming the nano-air-gap with the nano-trench. The method provides a robust LK/metal interconnection structure and its fabrication.

The present disclosure provides many different embodiments of fabricating a semiconductor IC that provide one or more improvements over other existing approaches. In one embodiment, a method for fabricating a semiconductor integrated circuit (IC) receiving a precursor. The precursor includes a substrate, conductive features over the substrate and a dielectric layer between the conductive features. The method also includes recessing the dielectric layer with a recessing depth d, depositing a neutralize layer (NL) over the recessed dielectric layer, depositing a block co-polymer (BCP) layer over the NL layer, annealing the BCP layer to form polymer nanostructures surrounded by a polymer layer over the dielectric layer, forming polymer nano-block by selectively etching the polymer layer using the polymer nanostructure as etch masks, selectively etching the dielectric layer using the polymer nano-blocks as etch masks to form nano-trenches in the dielectric layer, removing polymer nano-blocks and depositing a capping layer to seal the nano-trenches to form nano-air-gaps.

In another embodiment, a method for fabricating a semiconductor IC includes receiving a precursor. The precursor includes a substrate, conductive features over the substrate and a dielectric layer between the conductive features. The method also includes recessing the dielectric layer with a recessing depth d, depositing a neutralize layer (NL) over the recessed dielectric layer, depositing a block co-polymer (BCP) layer over the NL layer, annealing the BCP layer to form polymer nanostructures separated etch other by a polymer layer, over the dielectric layer, selectively etching the polymer layer and remaining the polymer nanostructure intact, selectively etching the dielectric layer using the polymer nanostructures as etch masks to form nano-trenches in the dielectric layer, removing the polymer nanostructures and sealing the nano-trenches to form nano-air-gaps.

In yet another embodiment, a method for fabricating a semiconductor IC includes receiving a precursor. The precursor includes a substrate, conductive features over the substrate and a dielectric layer between the conductive features. The method also includes recessing the dielectric layer with a recessing depth d, depositing a neutralize layer (NL) over the recessed dielectric layer, depositing a block co-polymer (BCP) layer over the NL layer, annealing the BCP layer to form polymer nanostructures separated etch other by a polymer layer, over the dielectric layer, selectively etching the polymer nanostructures to form nano-hollows in the polymer layer, selectively etching the dielectric layer through the nano-hollows to form a nano-trenches in the dielectric layer, removing the polymer layer and sealing the nano-trenches to form nano-air-gaps.

In yet another embodiment, a semiconductor IC includes a substrate, conductive features over the substrate and a dielectric matrix between the adjacent conductive features. The dielectric matrix includes a dielectric layer and one or more cylindrical column nano-air-gaps embedded in the dielectric layer. The nano-air-gap has fairly vertical sidewall profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
   receiving a precursor, the precursor including: a substrate; conductive features extending above the substrate; a dielectric layer between the conductive features; a first capping layer disposed on the conductive features;
   recessing the dielectric layer adjacent the conductive features with a recessing depth d, wherein the recessing provides a top surface of the dielectric layer below a top surface of the conductive features and the first capping layer;
   depositing a neutralize layer (NL) over the recessed dielectric layer;
   depositing a block co-polymer (BCP) layer over the NL layer having a thickness t that extends from the NL to a top layer, wherein t is greater than d such that the BCP layer overlies the conductive features and the first capping layer;
   annealing the BCP layer to form a first plurality of polymer nanostructures, wherein the first plurality of polymer nanostructures are surrounded by a polymer layer over the dielectric layer, and wherein the first plurality of polymer nanostructures are coplanar, on a horizontal plane above and parallel to a top surface of the substrate with at least one of the first capping layer and the conductive features;
   forming polymer nano-block by selectively etching the polymer layer using the polymer nanostructure as etch masks;
   selectively etching the recessed dielectric layer using the polymer nano-blocks as etch masks to form a plurality of nano-trenches in the dielectric layer, wherein each of the plurality of of nano-trenches has a bottommost surface defined by a surface of the recessed dielectric layer, wherein the bottommost surface lies above a bottommost surface of the conductive feature;
   removing polymer nano-blocks; and
   depositing a second capping layer over the nano-trenches and over the conductive features and first capping layer, wherein the second capping layer serves to seal the nano-trenches to form nano-air-gaps, wherein the nano-air-gaps are defined by the bottommost surface of each of the plurality of nano-trenches and a top surface defined by an interface with the second capping layer, and wherein the top surface is coplanar with the conductive features on another horizontal plane above and parallel to the top surface of the substrate.

2. The method of claim 1, wherein the BCP layer includes one or more materials from the group consisting of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

3. The method of claim 2, wherein the PS-b-PDMS layer is annealed to form the first plurality of polymer nanostructures including PDMS nanostructures surrounded by the polymer layer including a PS layer over the dielectric layer, wherein the PDMS nano structures are formed in cylindrical-shape and parallel to each other along a same direction as a length of the conductive feature.

4. The method of claim 3, further comprising:
   determining the recessing distance d, wherein the determining the distance is performed by considering a target distance D between the top surface of the first plurality of polymer nanostructures and the NL, wherein the PDMS nanostructures are formed to locate a same distance from the dielectric layer by controlling the recessing depth d.

5. The method of claim 3, wherein the polymer nano-block is formed by selectively removing the PS layer and using the PDMS nanostructure as an etch mask to protect the PS layer underneath of it.

6. The method of claim 1, wherein the nano-trench is formed with a similar width as the polymer nanostructure.

7. The method of claim 1, further comprising:
   forming the first capping layer on a top surface of the conductive features, wherein the forming includes depositing one of tantalum (Ta), titanium (Ti), manganese (Mn), cobalt (Co), ruthenium (Ru), titanium nitride (TiN), tantalum nitride (TaN), tungsten nitride (WN), titanium silicon nitride (TiSN), tantalum silicon nitride (TaSN), manganese oxide (MnO), aluminum nitride, and aluminum oxide.

8. The method of claim 1, wherein the first plurality of polymer nanostructures are coplanar with the first capping layer such that a top surface of the first plurality of polymer nanostructures is substantially coplanar to a top surface of the first capping layer.

9. The method of claim 1, wherein the conductive features include a barrier layer.

10. A method for fabricating a semiconductor integrated circuit (IC), the method comprising:

receiving a precursor, the precursor including: a substrate; conductive features extending above the substrate; and a dielectric layer between the conductive features;

recessing the dielectric layer adjacent the conductive features wherein the recessing provides the recessed dielectric layer with a recessing depth d, wherein the recessed dielectric layer has a uppermost surface above a bottom surface of the conductive features and below a topmost surface of the conductive features, wherein the recessing exposes a top portion of a sidewall of each of the conductive features;

depositing a neutralize layer (NL) over the recessed dielectric layer including on the uppermost surface of the recessed dielectric layer and on the top portion of the sidewall of each of the conductive features;

depositing a block co-polymer (BCP) layer over the NL layer;

annealing the BCP layer to form polymer nanostructures separated from each other by a polymer layer, over the dielectric layer, and wherein the polymer layer directly underlies each of the polymer nanostructures;

selectively etching the polymer layer using the polymer nanostructures as masking elements, thereby forming a plurality of nano-blocks disposed on the recessed dielectric layer each of the plurality of nano-blocks having a top portion of the polymer nanostructures and a bottom portion of the polymer layer;

selectively etching the recessed dielectric layer using the plurality of nano-blocks as etch masks to form nano-trenches in the dielectric layer, wherein the nano-trenches extend from a bottom surface to a top opening, wherein the top opening is coplanar with a bottommost point on the top portion of the sidewall of each of the conductive features;

removing the plurality of nano-blocks; and sealing the nano-trenches to form nano-air-gaps by interfacing with the top opening of the nano-trenches.

11. The method of claim 10, wherein the BCP layer includes one or more materials from the group consisting of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

12. The method of claim 10, wherein the nano-trench is formed with a similar width as the polymer nanostructure.

13. A method for fabricating a semiconductor integrated circuit (IC), the method comprising:

receiving a precursor, the precursor including: a substrate; conductive features extending above the substrate; and a dielectric layer between the conductive features;

recessing the dielectric layer with a recessing depth d, wherein the recessing exposes a portion of sidewalls of the conductive features;

depositing a neutralize layer (NL) over the recessed dielectric layer and the sidewalls of the conductive features;

depositing a block co-polymer (BCP) layer over the NL layer;

annealing the BCP layer to form polymer nanostructures separated from each other by a polymer layer, over the dielectric layer, wherein the polymer nanostructures are disposed between the conductive features;

selectively etching the polymer nanostructures to form nano-hollows in the polymer layer;

selectively etching the dielectric layer through the nano-hollows to form a nano-trenches in the dielectric layer, wherein the nano-trenches each have a sidewall that extends from a top point to a bottommost point, the top point below an uppermost surface of the conductive feature and the bottommost point above a lowermost surface of the conductive feature;

removing the polymer layer; and sealing the nano-trenches to form nano-air-gaps.

14. The method of claim 13, wherein the BCP layer includes one or more materials from the group consisting of polystyrene-block-polydimethylsiloxane block copolymer (PS-b-PDMS), polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

15. The method of claim 13, wherein the polymer nanostructures are formed in column-shape and parallel to each other along a same direction as a height of the conductive feature.

16. The method of claim 15, the polymer nanostructures are formed in a multiple rows along a direction of the length of the conductive feature.

17. The method of claim 13, wherein the nano-hollows are formed with a similar width as the polymer nanostructure, wherein the nano-trench is formed with a similar width as the nano-hollow.

18. The method of claim 13, wherein annealing the BCP layer to form polymer nanostructures forms polymer nanostructures disposed between sidewalls of the conductive features such that the polymer nanostructures and the conductive features are coplanar.

19. The method of claim 13, wherein the conductive features include a barrier layer.

* * * * *